United States Patent [19]

Ciszek et al.

[11] 4,075,055
[45] Feb. 21, 1978

[54] METHOD AND APPARATUS FOR FORMING AN ELONGATED SILICON CRYSTALLINE BODY USING A <110>{211}ORIENTATED SEED CRYSTAL

[75] Inventors: Theodore Frank Ciszek, Salt Point; Guenter Herbert Schwuttke, Poughkeepsie, both of N.Y.

[73] Assignee: International Business Machines Corporation, Armonk, N.Y.

[21] Appl. No.: 677,580

[22] Filed: Apr. 16, 1976

[51] Int. Cl.² .................. B01J 17/18; C01B 33/02
[52] U.S. Cl. ..................... 156/608; 156/617 SP; 156/DIG. 64; 156/DIG. 88; 156/DIG. 65; 23/273 SP; 156/DIG. 93
[58] Field of Search ......... 156/608, 617 SP, DIG. 64, 156/DIG. 65, DIG. 84, DIG. 86, DIG. 88, DIG. 93; 23/273 SP; 423/324

[56] References Cited

U.S. PATENT DOCUMENTS

| B 584,997 | 3/1976 | Ciszek .................................. 156/608 |
| 3,129,061 | 4/1964 | Dermatis et al. ................. 156/619 X |
| 3,226,269 | 12/1965 | Allegretti et al. ................ 156/606 X |
| 3,394,994 | 7/1968 | Faust, Jr. et al. ...................... 156/619 |
| 3,650,703 | 3/1972 | Labelle, Jr. ............................ 156/608 |
| 3,687,633 | 8/1972 | Labelle, Jr. et al. ................. 156/608 |
| 3,953,174 | 4/1976 | Labelle, Jr. ......................... 156/608 X |

*Primary Examiner*—Stephen J. Emery
*Attorney, Agent, or Firm*—George O. Saile

[57] ABSTRACT

Method and apparatus for forming an elongated silicon crystalline body using a capillary action shaping technique. The means for growing and pulling the body from the capillary of the die includes a <110>{211-}oriented seed crystal.

4 Claims, 18 Drawing Figures

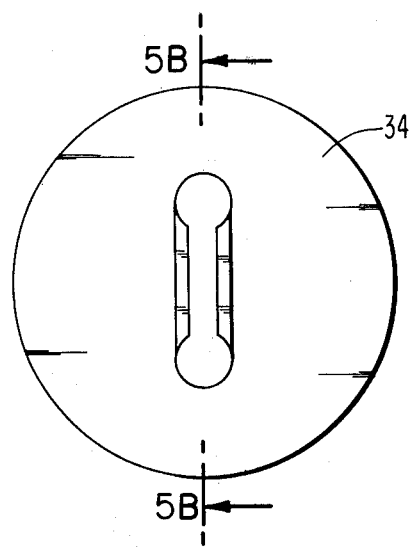
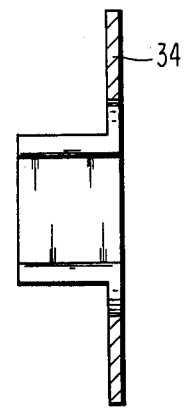
FIG. 5A  FIG.5B
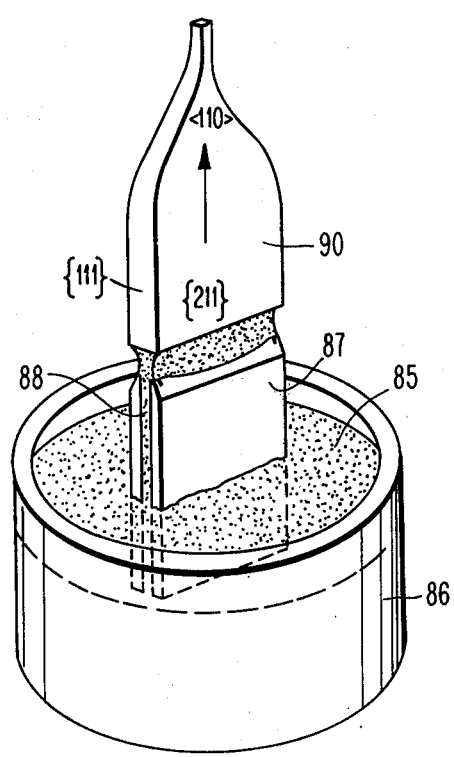
FIG. 6
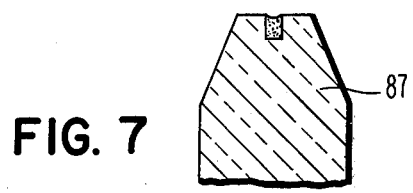
FIG. 7
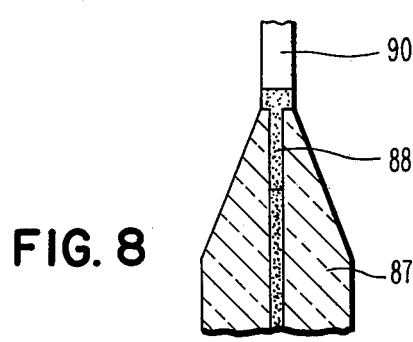
FIG. 8
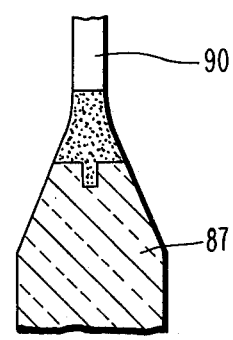
FIG. 9

METHOD AND APPARATUS FOR FORMING AN ELONGATED SILICON CRYSTALLINE BODY USING A <110>{211}ORIENTATED SEED CRYSTAL

BACKGROUND OF THE INVENTION

The invention relates a 21 apparatus for improving the capillary action crystal growth techniques for silicon.

CROSS REFERENCES TO RELATED APPLICATIONS

"Method and Apparatus for Forming Silicon Crystalline Bodies" Ser. No. 677,579, T. F. Ciszek, filed simultaneous with this application, describes a method and apparatus for forming an elongated silicon crystalline body using a specially designed capillary die. The method and apparatus uses a higher melt meniscus in the central region of the growth front than at the edges of the front. The edges of the top surface of the die are not concentric with the ribbon cross-section.

DESCRIPTION OF THE PRIOR ART

The growth of monocrystalline silicon is usually accomplished by the Czochralski or float-zoning techniques which produce solid cylindrical monocrystals. Ribbon shaped silicon has been formed by several techniques. The dendritic web growth method entails the solidification of a silicon sheet from a melt meniscus which is bounded at the ends by thin dendrites growing downward into a super-cooled melt region and bounded at the top by a ribbon-melt interface. This dendritic web technique can be understood in greater depth by reference to the publications of S. N. Dermatris et al, IEEE Trans, Commun. and Electronics, Vol. 82, 94 (1963) and D. L. Barrett et al, J. Elec. Chem. Soc., vol. 118, 952 (1971). The Stepanov method utilizes a non-wetting die, in contact with the melt, to shape the meniscus for ribbon growth as described in A. V. Stepanov, Zh, Tekh, Fiz. Vol. 29, 381 (1959) and J. Boatman et al, Elec. Chem. Tech. Vol. 5, 98 (1967).

More recently, a capillary action shaping technique has been devised for the growth of crystals with complex cross-sectional shapes. The technique was first applied to the growth of sapphire crystals, and was called Edge-defined, Film-fed Growth (EFG). It has since been applied to many other materials, including silicon. In the EFG technique, the crystal is grown from a thin molten zone of liquid at the top surface of a capillary die. As the crystal grows, fresh liquid is supplied from the melt reservoir in a crucible via capillary rise through channels in the die. The outer edges of the die top bound the lower portion of the meniscus from which the crystal grows and hence determine its shape. While numerous shapes have been grown, most work has concentrated upon ribbons, rods, and tubes, especially ribbons. This technique can be understood with reference to papers of H. E. LaBelle, Jr., Materials Research Bulletin, Vol, 6, 581 (1971), U.S. Pat. No. 3,591,348, issued July 6, 1971 to H. E. LaBelle, Jr., T. F. Ciszek, Materials Research Bulletin, Vol. 7, 731 (1972), T. F. Ciszek, et al, Physical Stat. Sol. Vol. 27, 231 (1975) and J. C. Swartz et al, Journal Electron Materials Vol. 4, 255 (1975).

Some advantages of the capillary action shaping technique include the elimination of post-growth wafering or shaping, a potential for continuous growth and processing, minimal solute segregation, and a high linear growth speed. However, the technique also has drawbacks. These include the requirement for a non-reactive, insoluble, durable and wettable shaping die, critical isotherm control requirements at the die top, generally poor crystal structure (for silicon) and a low material throughput rate.

During silicon elongated crystal growth from carbon dies, small silicon carbide crystallites form in the orifice of the die. Such crystallites are also found floating in the meniscus at the top of the die. More or less frequently such a particle becomes attached to the silicon crystal thus destroying the perfection of the crystal. Similar observations are made on the outside of a carbon die in contact with the molten silicon. Crystallites accumulate in the orifice of the carbon die used for crystal growth. Scanning electron micrographs of such small crystals show these crystals to appear equi-axed and expose mainly (111) and (100) surfaces. The morphology of these crystals is in agreement with the growth from a liquid phase by precipitation. Some of these crystals are found in clusters bonded to each other with a very limited area where their orientations are identical. It appears that the small crystals are grown by this technique as an unwanted "side-product" of Si ribbon pulling.

Another problem in the growth of elongated silicon crystals is twinning. Twinning means an abrupt rotation of 180° of the crystal atomic structure on a {111} crystal plane. This effect disrupts crystal growth from the seed crystal during the nucleation stage and results in not a single crystal elongated silicon body but a body of polycrystalline silicon.

Twinning is a dominant mechanism during crystal growth of silicon ribbons and of great influence on the perfection of the ribbon. The nucleation frequency of twins is very high during the initial seeding operation and substantially lower during "steady-state" growth. The nucleation events leading to twinning can be categorized by twinning during seeding and twinning at surface inclusions.

SUMMARY OF THE PRESENT INVENTION

A method and apparatus for forming silicon crystalline bodies is described where a <110> {211} oriented seed crystal is used. This orientation has been found to reduce the accumulation of crystallites in the orifice of the die during growth. Also, the twinning disruption of the growth of single crystals during the nucleation phase is overcome. When twinning occurs where the original growth plane is {110}, the original crystal orientation of <110> will be repeated. This allows the continuation of crystal growth without interruption and the undesirable formation of polycrystalline silicon. Twin boundaries when produced are parallel to the <110> growth direction.

It is possible to produce an extremely thin elongated body of silicon by use of heat modifiers positioned above the die and along the path of the silicon crystalline body being grown. For a ribbon structure, two parallel metal plates closely positioned on either side of the silicon ribbon allows the production of silicon ribbon which is in the order of microns or thinner in thickness.

BRIEF DESCRIPTION OF THE DRAWINGS

FIGS. 5A and 5B is a drawing of a thermal modifier or heat shield useful in growing thin ribbons of crystalline silicon;

FIGS. 6, 7, 8, and 9 are schematic representations of the method for growing elongated crystals of the present invention;

DESCRIPTION OF THE PREFERRED EMBODIMENTS

Figure 1:
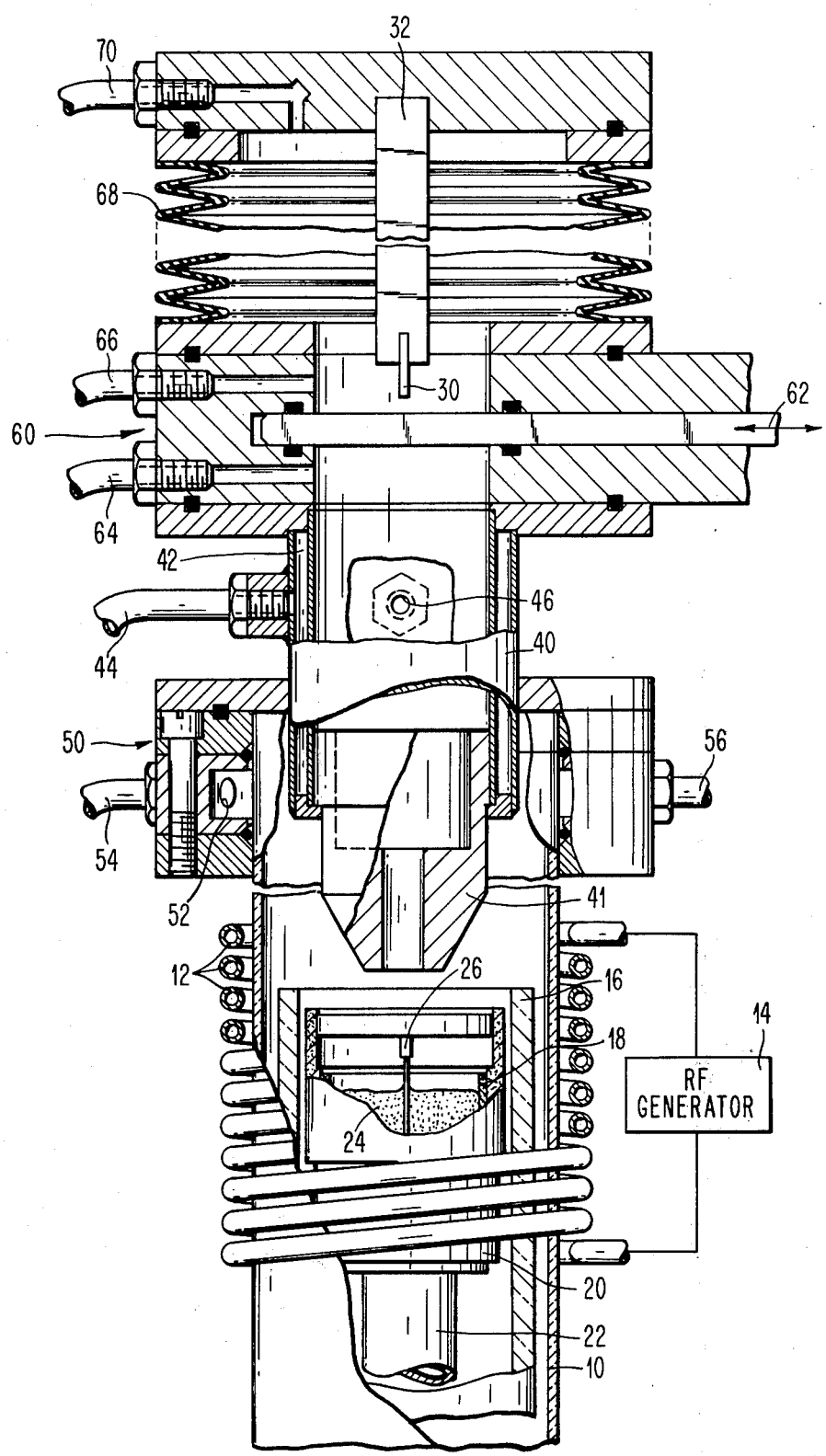
FIG. 1 is a overall view of the crystal pulling apparatus of the present invention which is principally in cross-section.

FIG. 1 illustrates the apparatus for forming elongated silicon bodies of the present invention. The apparatus includes a quartz tube 10 in which is the hot-zone of the furnace. The source of heat for this portion of the furnace is the RF coil 12 which is connected to the RF generator 14. Within this hot-zone is an insulator 16 and within the insulator 16 is a conductive susceptor which holds the crucible 18, the susceptor support 20 and the shaft 22 on which the supported crucible is mounted. Within the crucible is the molten silicon 24 and the die 26. The die can be made of carbon or silicon carbide. A crystal being grown (not shown) is pulled and grown through the central portion of the structure above the die and is supported by the seed chuck 30 which is supported by shaft 32. Just above the hot-zone of the furnace is the water-cooled purge tube assembly 40. The water jacket is cooled by water flowing into the water jacket 42 through inlet pipe 44 and outlet pipe 46. Also associated with this water cooling system is a water-cooled end seal structure 50 which has water flowing into the cooling jacket 52 through inlet tube 54 and out the water jacket through outlet tube 56. A similar structure is used at the bottom of the quartz tube 10 (not shown). These end structures allow gas tight connections to be made to the quartz tube 10 and also cool the ends of the tube. The gate valve has inert gas purging system input tube 64 and output tube 66. The plastic bellows of the system 68 is partially broken as indicated and it is long in height to give the ability of growing long silicon crystalline bodies. There is an inert gas inlet 70 at the top of the bellows.

The closed, gaseous tight system shown in FIG. 1 results in a cleaner silicon melt at the die top surface and a resulting cleaner elongated silicon crystalline body. The use of inert gas, such as argon, purging has further improved the character of the silicon bodies grown within the apparatus. The gas sweeps away any silicon oxides or vapor of silicon carbide which may be contaminating the melt and limiting perfection of the crystal body being grown. The purging is accomplished by closing the vacuum gate valve 60 by movement of its slider 62 across the opening and the region below the valve is evacuated. Inert gas such as argon is then passed through the inlet port 64 in the gate valve. When the lower chamber is filled with argon, an argon outlet to a bubbler (not shown) at the bottom of the chamber is opened. Simultaneously, the plastic bellows section 68 above the gate valve is argon purged through the argon inlet 70 and outlet 66. The seed shaft 32 is initially located in this section. When both sections have been purged an adequate length of time, and the die is at growth temperature, the argon outlet 66 above the gate is closed and the gate valve 60 is opened. Argon then flows from the inlet 70 at the bellows top and the inlet at the gate valve 64 downward through the water-cooled purge tube 40 which surrounds the crystalline body to be grown. From the bottom of this purge tube, the graphite draw tube 41 can be supported. The oval bore of the draw tube 41 causes the purge gas to impinge on the solidification region at the die top. The gas then flows out the bottom of the furnace through a bubbler (not shown). After growth, the ribbon is pulled up into the bellows 68 and the gate valve 60, 62 is closed. The bellows is then opened to remove the silicon body and reseed for subsequent growth.

Figure 2:
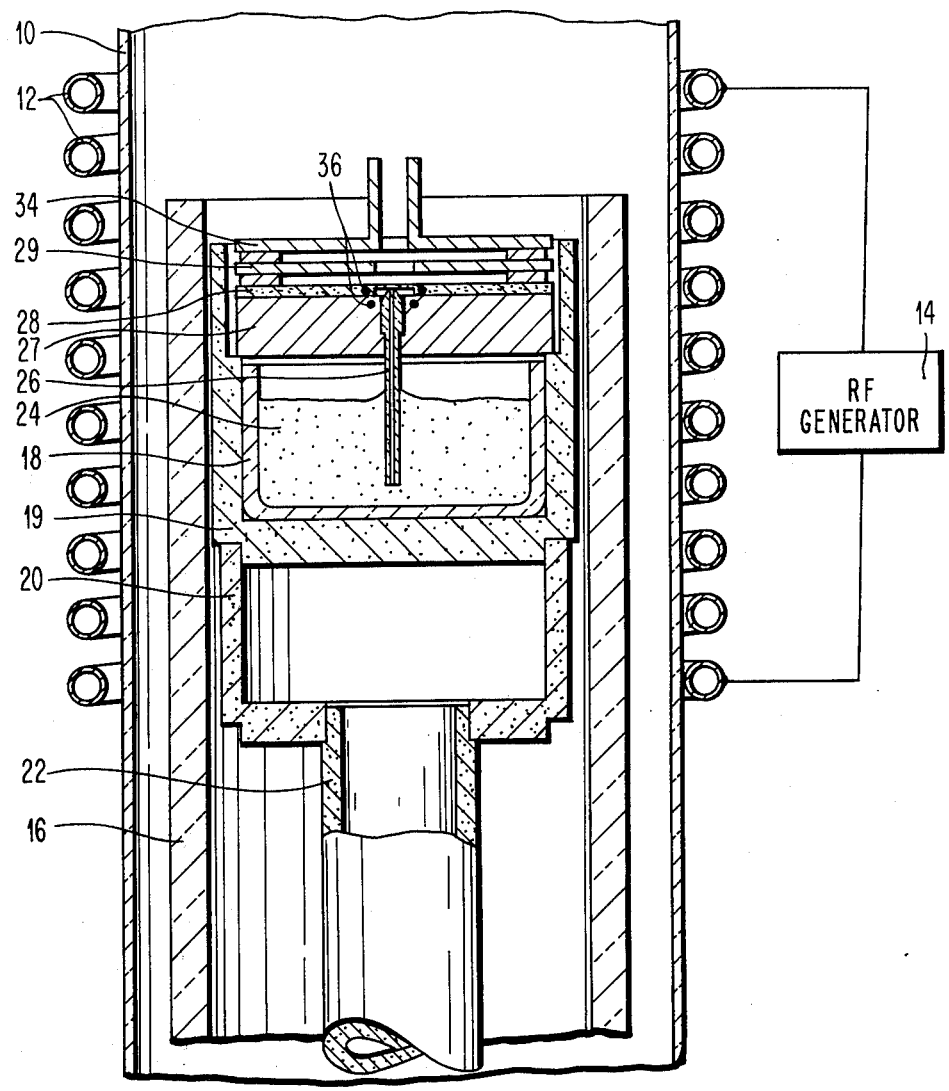
FIG. 2 is a cross-sectional view of the melt, die and thermal modifier section of the crystal pulling apparatus.

FIG. 2 shows an enlarged detailed view of the hot-zone of the apparatus for forming elongated silicon crystalline bodies. The quartz furnace shell 10 is partially surrounded by RF coil 12 which is connected to the RF generator 14 for heating purposes. An insulator 16 within the draw tube surrounds the crucible 18 containing the molten silicon 24. The crucible 18 is positioned within the susceptor 19 which is in turn supported by support 20 which is on shaft 22. The die 26 having at least one capillary therein is positioned partially submerged in the molten silicon 24 and has a generally truncated wedge-shaped top. The molten silicon wets the die and moves into the capillary and by capillary action moves to the top surface of the die 26. The die is held in place by holder 27. Three thermal modifiers are shown in this embodiment. The thermal modifiers are a lower heat shield 28, upper heat shield 29 and the topmost heat shield 34 which has vertical projections substantially above its horizontal surface which extend along the path of the growing silicon body. This topmost heat shield is only utilized where it is desired to produce a silicon body having a thickness in the order of 10 microns or thinner. In other circumstances it is not necessary to utilize this topmost heat shield 34.

The very thin silicon bodies, such as ribbons of silicon, are very desirable for some applications such as a photovoltaic silicon solar cell. If economical production of electrical energy from such devices is to be obtained, the amount of silicon used in the device must be small. Thus thin sheets of silicon are desirable if they can be solidified directly in a form so that the material is not wasted by sawing or polishing. The topmost heat shield 34 allows the production of thin sheets of silicon down to thicknesses of less than one micron in the central region of silicon ribbons. The heat shield having the two parallel vertical plates in close proximity to the central portion of the growing silicon ribbon allows the crystallization and pulling of such a thin ribbon. The shield is typically made of molybdenum. The detailed structure of this heat shield 34 is shown in FIGS. 5A and 5B.

Where it is desired to form wider ribbon widths than about 1 centimeter it is necessary to be concerned about the uniformity of temperature across the width of the growing crystal. In the case of even wider ribbons of width greater than about 4 centimeters, auxillary heating or cooling techniques are required to assure the desired temperature distribution across the crystal at the solid liquid interface during growth. One means for assuring this is the use of segmented heating means 36 which allow the application of different amounts of heat at various positions across the die. A second technique is to direct the flow of the inert gas in different controlled amounts to different segments of the liquid solid crystal interface so as to maintain the desired growth temperature across the growing body's interface. This later technique, of course, is a cooling technique.

Problems which occur when using a flat top die for capillary action crystal growth come about primarily from the fact that the die is virtually always made of graphite and hence slowly dissolves in the liquid silicon. The silicon then is saturated with carbon and the saturated silicon rises up the capillary slot in the die and comes to the top region where crystal body growth occurs. This top region is the coolest region in the growth system. The excess carbon which is in the saturated silicon is forced out of the solution and comes out in the form of silicon carbide crystallites which tend to collect in the top surface of the die because the temperature is lower here than in the bulk melt. These crystallites near the top surface tend to distort the melt meniscus and make the ribbon non-uniform in its surface smoothness. Another problem that occurs is due to the close proximity of the freezing interface to the die top. The silicon carbide particles at the interface tend to be incorporated in the ribbon and generate dislocations and other defects.

Figure 3A:
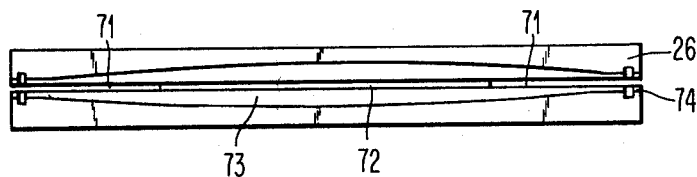
FIGS. 3A, 3B and 3C are detailed drawings of one form of the die of the present invention.
Figure 3B:
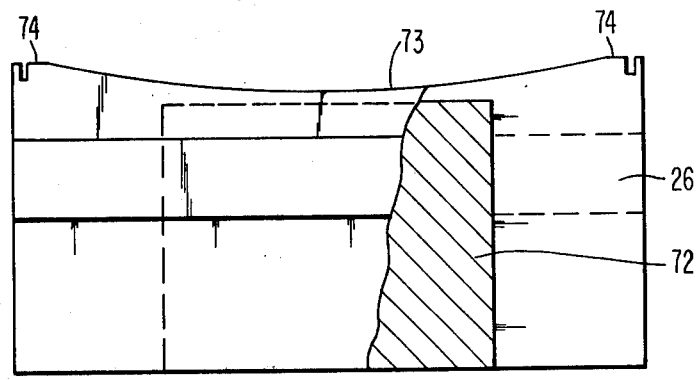
Figure 3C:
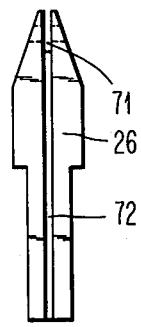

It has been found that it is advantageous to keep the interface of the freezing ribbon as far as possible from the die top. FIGS. 3A, 3B and 3C illustrate one embodiment of a die structure which accomplishes this. FIGS. 3A, 3B and 3C show the capillary 71 in die 26 and the central portion 72 which holds the die 26 together. The die top surface 73 is curved so that it is higher at the edges 74 than in the middle. In this way if the crystal body solid/liquid interface can be maintained approximately planar, then the interface is further from the die at least in the central region. The central region is most critical for generation of defects in the silicon body. However, if the width of the die top is kept constant while the die top is curved, then the fact that the interface is higher in the central region means that the meniscus there is also higher and hence the meniscus would be quite thin in the central region. This would cause the ribbon to be very non-uniform in thickness from one edge to the other. It would be much thinner in the middle than at the ends. So not only should the die top curve downward from the ends 74 toward the central region but it must also become wider in the central region than at the ends 74. The meniscus then has a wider base in the central region. The wider base combined with the greater meniscus height in the central region results in a uniform thickness at the solid/liquid interface. In summary, there are two things that are important to the die design, one is the curvature and the other is the widening of the die top in the central region.

This die structure 26 is different from the edge-defined film-fed technique of the prior art, because in that technique the cross-section of the growing ribbon or other shape is concentric with the top of the die. The cross-section of the ribbon or other shape is not concentric with the die top using the FIGS. 3A, 3B and 3C die structure. The die top surface is bowed out considerably in the middle at 72 and is thin at the edges 74 but yet a uniform thickness ribbon or other shape crystal is grown.

Figure 4:
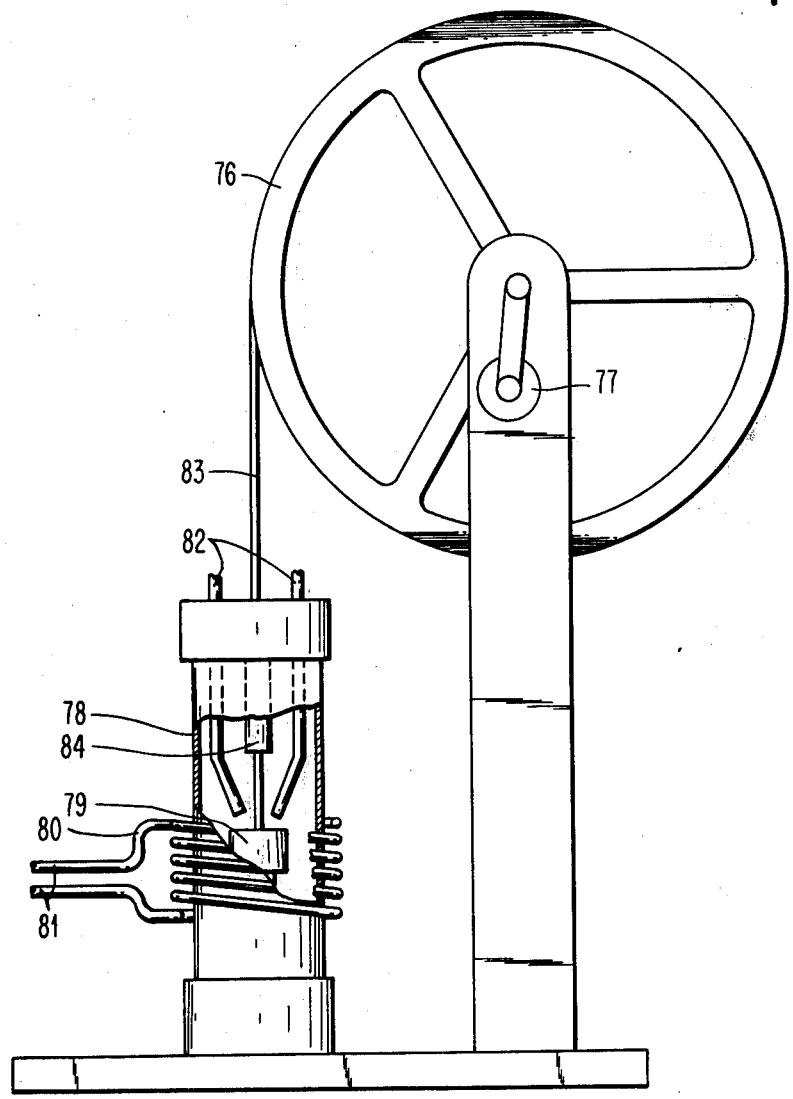
FIG. 4 is a schematic illustration of one form of a continuous silicon ribbon growth apparatus.

FIG. 4 illustrates a continuous growth ribbon process wherein as the ribbon is grown it is pulled and then wound on a ribbon pulling and wind-up mechanism 76 which may be driven by a motor 77. The actual ribbon growth furnace 78 is similar to that shown in FIGS. 1 and 2 wherein the hot-zone or growth-zone 79 is heated by typically RF heater 80 with RF power thereto from a suitable RF generator from lines 81. However, other heating means can be used. Inert gas inlets 82 are directed onto the crystal liquid-solid interface of the ribbon being pulled and grown. The ribbon 83 is pulled through the pull port and inert gas outlet port 84 and then is flexible enough to be wound upon the wind-up mechanism 76 as illustrated. The flow of argon out the pull port 84 prevents diffusion of air into the furnace while providing a means of removing the ribbon. Other means of sealing the system such as a liquid seal through which the ribbon passes could be used.

The method for forming elongated silicon crystal bodies can be further understood, particularly by reference to FIGS. 6, 7, 8 and 9. The capillary action shaping technique, as shown in FIG. 6 has molten silicon 85 in a crucible 86 with a partially submerged capillary die 87 therein. The liquid which is going to be crystallized rises up a capillary slot 88 to the top surface of a die 87. When the liquid reaches the top of the slot it no longer continues its motion as in FIG. 6. However, if a crystal 90 is dipped into the thin slot and begins to pull the liquid upward, the contact angle of the liquid with the die then changes. The contact angle is such that the liquid can spread laterally over the top surface of the die until the limiting edges of the die top surface are reached. The edges determine the lower attachment perimeter of the melt meniscus.

The thickness of the ribbon crystal being grown in FIG. 6 when the curve top die with variable top width is used is essentially equal to the thickness of the die top near the ends of the die. The ribbon is essentially uniform in thickness although there may be slight variations across it. In the typical case, the mid region of the ribbon is somewhat thinner than the edges. The edges of the ribbon are about as thick as the edge thickness of the die top.

FIG. 7 is a cross-section of the FIG. 6 at the center of the die prior to applying the seed crystal 90. No through capillary is shown because this is the area that holds the two major portions of the die 87 together. FIG. 8 shows the edge condition with the ribbon in place and FIG. 9 the central portion with the ribbon in place. It can be seen that even though the top of the die is narrow at the ends and relatively wide in the middle, the ribbon thickness is essentially uniform because the freezing interface is close to the die top near the ends of the die, but higher above the die top near the middle. The top of the meniscus is about as wide as the bottom of the meniscus at the end areas. However, the cross-section of the meniscus near the central point of the die and ribbon tapers from a wide base to a narrow top. By proper choice of the curvature of the die top and the taper angle of the sides of the die an optimum value for this variation of the width of the die top with position along the die top can be obtained. A principal parameter which enters into the design of the die is the distance which the freezing interface is from the top of the die near the central region. The distance of the interface from the top surface of the die can be adjusted by varying the curvature of the die top surface. The other parameter used to determine the thickness variation of the die along the top surface is the taper angle of the sides of the die.

For growth of ribbons up to about 3 cm. in width, the outer edges of the top die surface, that is those edges which bound the lower portion of the melt meniscus from which the ribbon solidifies can be considered to be determined by the intersection of a vertical truncated wedge with enclosed angle — $\phi$ truncated thickness — $X_e$ and width — W with a horizontal cylinder of radius R.

The intersection is made essentially such that the cylindrical surface contains the short edges, $X_e$, of the wedge top. The resultant die top is that of FIGS. 3A, 3B and 3C where $X_e$ is the top surface thickness at the ends, $X_m$ the top surface thickness in the center, $\phi$ the enclosed angle, R the radius of curvature of top surface, W the width of die, and $\delta$ the difference in height from ends to center. The top of the die thus smoothly increases in thickness from $X_e$ to $X_m$ and decreases in height, by an amount $\delta$, as we go from the die edge to the die middle.

The objective in this design is to attain a high melt meniscus in the central region, since close proximity of the freezing interface to the die top is detrimental to ribbon perfection and surface smoothness, while still maintaining the close proximity at the die ends to stabilize the ribbon width. Furthermore, this must be achieved in a smooth transition to facilitate the early stages of growth from seed size to full width.

The ribbon thickness is less than or equal to $X_e$. R and $\phi$ are chosen to optimize the values of $X_m - X_e$ and $\delta$ for successful ribbon growth. These parameters are given by $$\delta = R - \frac{W}{2 \tan (\sin^{-1} \frac{W}{2R})}$$

$$X_m - X_e = 2 \delta \tan \phi/2$$

Experimentally, values of $\delta \cong 0.8$ mm and $X_m - X_e \cong 0.6$ mm are found to be useful for producing smooth silicon ribbons. Thus, for example, a 25.4 mm wide die was used with $X_e \cong 0.51$ mm, R = 101.6 mm, and $\phi = 40°$. Such a die produces ribbons of < 0.5 mm thickness even though $X_m$ is about 1.09 mm. Thus, the cross-section of the ribbon is not "edge-defined" by the edges of the die top. Where the width of the die is greater than about 3 cm., the central region of height $-\delta$ and width $X_m$ is extended somewhat before beginning the narrowing and rising to the ends of the top surface.

In the solidification of a crystal body, it is necessary to maintain a uniform temperature across the crystal at the growing interface. Thermal stresses in the body results if the variation of temperature is not correct. For this reason, it is common to use thermal modifiers or heat shields with the slot very close to the size of the crystal body with just a small clearance on each side. A shield of this type tends to stabilize the temperature near the freezing interface. Thermal stresses in the ribbon can be alleviated by properly controlling the temperature gradient along the crystal. Small variations in temperature can cause also problems in freezing up the ribbon to the die. The solution to more careful control of the profile near the die top surface in a continuously variable way is to build a segmented heater which is in close proximity to the top surface of the die and goes along the length of the die. The heater is segmented and the segments are individually controlled by electrical input. It is thereby possible to contour the thermal profile at the die top.

Figure 10:
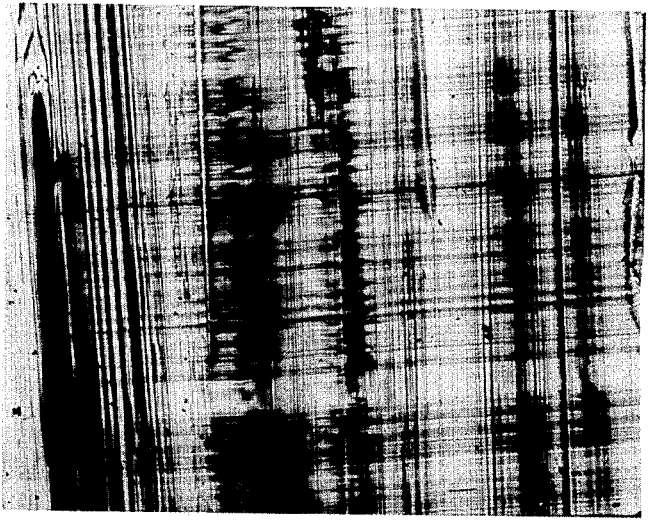
FIG. 10 is 21 21 times enlarged photomicrograph of as-grown ribbon surface using a constant meniscus die of the prior art.
Figure 11:
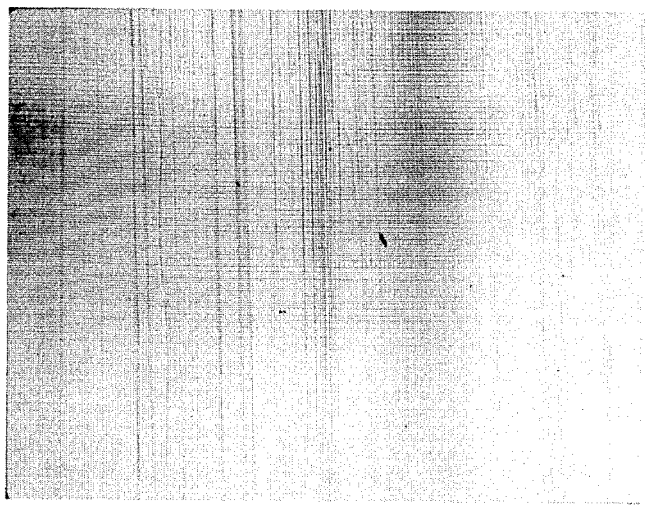
FIG. 11 is a 21 times photomicrograph of as-grown ribbon surface using the variable meniscus die of the present invention.

In FIGS. 10 and 11 the central region surfaces of two ribbons are shown at 21× magnification. Both ribbons were grown from 25.4 mm wide dies. The ribbon of FIG. 10 was grown from a flat-top EFG die of 0.5 mm top thickness. The ribbon of FIG. 11 was grown using the die design of the present invention with R = 101.6 mm, $X_e$ = 0.5 mm, and $\phi$ = 40°. The growth speeds were about 2 cm/min., and both dies were made of the same type of graphite. The ribbon of FIG. 11 had a much smoother surface as shown, and also a much lower density of silicon carbide particles imbedded in the surface. Thus the perfection is improved and less surface treatment is required to use the ribbon. MOSFET and solar cell devices have been made successfully on as-grown surfaces of smooth ribbons like those of FIG. 11.

Figure 12:
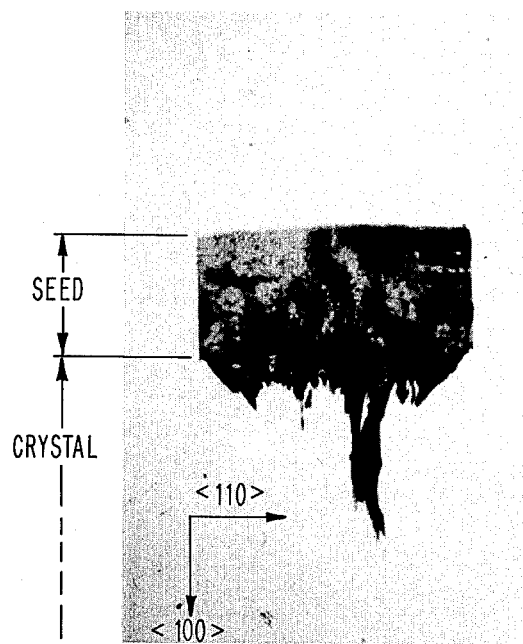
FIGS. 12 and 13 are transmission x-ray topographs of a seed crystal interface and 15 centimeters below the interface, respectively, for the prior art seed orientation.
Figure 13:
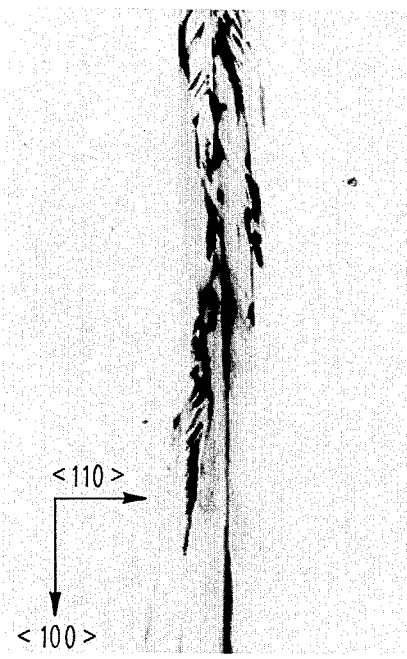

One of the major problems in the growth of silicon ribbons using carbon dies is twinning. Twinning disrupts the growth of single crystals during the nucleation phase. An example of the effect is shown in FIG. 12. FIG. 12 utilizes a seed orientation <100> {110}. Similar results occur for <111> {110}, <110> {100} and other common orientations. For all these orientations single crystal ribbons were not obtained. The dominant mechanism for preventing single crystal growth was uncontrolled twinning on all octahedral {111} planes. Possibilities of twinning for different growth planes such as (100), (110), (111) are summarized in Table I. An explanation of the Miller indices may be found, for example, in "Introduction to Solid State Physics" by C. Kittel Second Edition 1956, John Wiley & Sons, Inc. New York, N.Y., pages 33–35.

TABLE I

| Original Plane | Twinning Plane | New Plane |
| --- | --- | --- |
| (1 0 0) | (1 1 1) | (1 $\bar{2}$ $\bar{2}$) |
|  | ($\bar{1}$ 1 1) | (1 2 2) |
|  | (1 $\bar{1}$ 1) | (1 2 $\bar{2}$) |
|  | ($\bar{1}$ $\bar{1}$ 1) | (1 $\bar{2}$ 2) |
| (1 1 0) | (1 1 1) | (1 $\bar{1}$ 4) |
|  | ($\bar{1}$ 1 1) | (1 1 0) |
|  | (1 $\bar{1}$ 1) | (1 1 0) |
|  | ($\bar{1}$ $\bar{1}$ 1) | ($\bar{1}$ $\bar{1}$ 4) |
| (1 1 1) | (1 1 1) | ($\bar{1}$ $\bar{1}$ $\bar{1}$) |
|  | ($\bar{1}$ 1 1) | (5 1 1) |
|  | (1 $\bar{1}$ 1) | (1 5 1) |
|  | ($\bar{1}$ $\bar{1}$ 1) | (1 1 5) |

Twinning occurs on the octahedral planes. Four out of eight octahedral planes are listed. Two of these planes are always parallel to each other and thus equivalent. Continuous twinning on these planes will lead immediately to a breakdown in single crystal structure propagated from the seed crystal. The possibilities are listed in Table I. It has been found that the most important plane to use as the solid/liquid interface plane is the {110} because twinning repeats the orientation <110>. If the original seed interface plane is (110), then twinning on ($\bar{1}$11) is followed by repeating the original crystal orientation which is [110], for example as shown in Table I.

To grow ribbons with a minimum of defects, the epitaxial relationship between silicon and silicon carbide must be observed. It has been found that silicon and silicon carbide have a perfect epitaxial relationship for the <110> {112} seed orientation. Only for this orientation <110>, silicon carbide planes are parallel to the {110} silicon planes while concentrically the {111} silicon carbide planes are also parallel to the {111} silicon planes. For any other seed orientation, the epitaxial relationship with the silicon and silicon carbide is such that twinning on all octahedral planes will be activated. The different epitaxial relationships are summarized in Table II.

TABLE II

| Plane of Si Substrate | Plane of SiC Layer | Orientation | |
|---|---|---|---|
| (0 0 1) | (0 0 1)β | (1 0 0)β | (1 0 0)Si |
|  | (1 1 0)β | (0 0 1)β | ($\bar{1}$ 1 0)Si |
|  |  | (1 $\bar{1}$ 0)β | ($\bar{1}$ 1 0)Si |
| (1 1 0) | (1 1 0)β | (1 $\bar{1}$ 1)β | (1 $\bar{1}$ 1)Si |
| (1 1 1) | (1 1 1)β | (1 $\bar{1}$ 0)β | (1 $\bar{1}$ 0)Si |
|  |  | ($\bar{1}$ 1 0)β | (1 $\bar{1}$ 0)Si |
| (1 1 1) | (0 0 0 1)H | (1 1 $\bar{2}$ 0)H | (1 $\bar{1}$ 0)Si |

Figure 14:
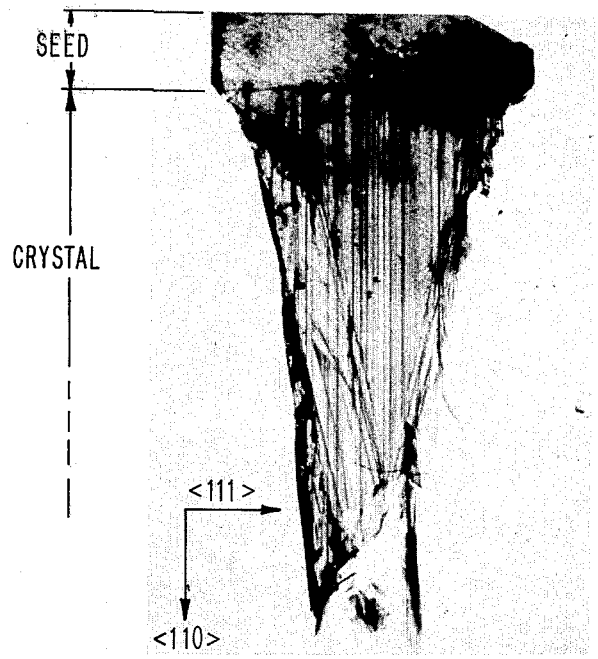
FIGS. 14 and 15 are transmission x-ray topographs of the seed crystal interface and 15 centimeters below the interface, respectively, for the seed orientation of the present invention.
Figure 15:
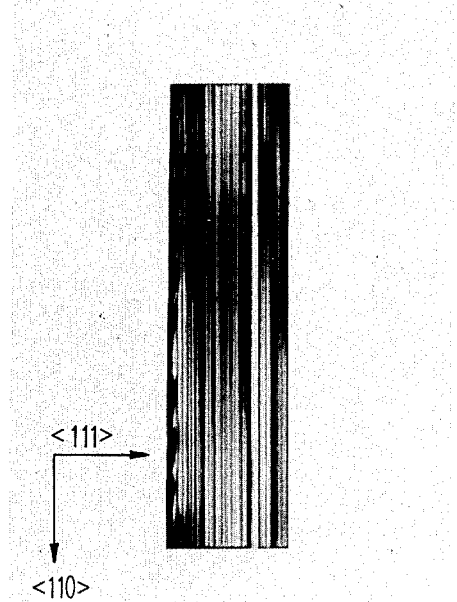

For instance, take a (001) silicon plane. There are two possible epitaxial relationships. Silicon carbide layers can grow on an (001) silicon plane in the [001] orientation and also in the [110] orientation. If they grow in the [001] orientation, there is an orientation relationship in which (100) silicon carbide planes are parallel to the (100) silicon planes. In the second case, if the silicon carbide layer falls in the [110] orientation then the orientation relationship is such that (001) silicon carbide is parallel to the ($\bar{1}$10) silicon plane and also the (1$\bar{1}$0) silicon carbide is parallel to the ($\bar{1}$10) silicon. Considering the [111] silicon orientation, then silicon carbide can also grow in the [111] direction and there are two possibilities for the silicon carbide relationship as shown also in Table II. However, in a (111) silicon substrate a possibility may occur where the silicon carbide grows not in the cubic form, β, but in the hexagonal mode, H. The cubic mode is indicated in Table II by a β and the hexagonal mode by an H. The preferred seed orientation for growing silicon ribbons is <110> {112}, as given in FIG. 14 and FIG. 15. FIG. 14 shows the seed crystal interface for this orientation and indicates that single crystal growth with parallel twinning has been achieved. The optimum silicon seed crystal orientation is [0$\bar{1}$1] in the pulling direction, [011] in the direction of the die, [$\bar{1}$12] perpendicular to the major surface of the seed and [111] perpendicular to the edge face of the seed. The only defects visible are due to parallel twinning on the ($\bar{1}$1$\bar{1}$) planes as described in Table I above. The parallel twins are low energy faults and have no influence on charge carrier generation lifetime. Therefore good solar cell efficiency is obtained even if such twin planes are present. Other twin planes are of higher order and therefore they have influence on generation lifetime. FIG. 15 shows a crystal section after 15 centimeters of growth. This section also contains only parallel twinning. Solar cell efficiency in the presence of parallel twinning is between 8 and 10 percent.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. Method for growing an elongated silicon crystalline body comprising:
    establishing a molten film of silicon overlying the top surface of a carbon containing capillary die;
    growing and pulling said body from the film by using a <110> direction, {211} face plane, {111} edge plane, oriented silicon seed crystal whereby said pulling being in the <110> direction with {211} face plane and {111} edge plane which results in twinning along the <110> direction perpendicular to the {211} face plane, and parallel to the {111} edge plane of said body and which allows any carbon impurities to be incorporated into said body so as to prevent significant nucleation of additional defects.

2. The method of claim 1 wherein the said die is composed of carbon.

3. The method of claim 1 further comprising:
    pulling the body through a heat shield which extends from a point near said die along the path of the body so as to produce a said body in the order of microns or thinner in thickness.

4. The method of claim 3 wherein said body is a ribbon and said heat shield includes two parallel plates in close proximity to said ribbon.

* * * * *